United States Patent
Fukasaku

(10) Patent No.: US 12,038,487 B2
(45) Date of Patent: Jul. 16, 2024

(54) DISCONNECTION DETECTING SYSTEM AND DISCONNECTION DETECTING METHOD

(71) Applicant: Proterial, Ltd., Tokyo (JP)

(72) Inventor: Izumi Fukasaku, Tokyo (JP)

(73) Assignee: PROTERIAL, LTD., Tokyo (JP)

( * ) Notice: Subject to any disclaimer, the term of this patent is extended or adjusted under 35 U.S.C. 154(b) by 642 days.

(21) Appl. No.: 17/214,013

(22) Filed: Mar. 26, 2021

(65) Prior Publication Data
US 2021/0304922 A1    Sep. 30, 2021

(30) Foreign Application Priority Data

Mar. 30, 2020 (JP) ................................. 2020-060046
Sep. 30, 2020 (JP) ................................. 2020-164272

(51) Int. Cl.
G01R 31/54 (2020.01)
G01R 31/58 (2020.01)
H01B 7/32 (2006.01)

(52) U.S. Cl.
CPC ..... *G01R 31/54* (2020.01); *G01N 2203/0023* (2013.01)

(58) Field of Classification Search
CPC .......... H01B 7/32; G01R 31/54; G01R 31/58; G01R 31/60
See application file for complete search history.

(56) References Cited

U.S. PATENT DOCUMENTS

2002/0085327 A1* 7/2002 Kim .................... H02H 3/04
361/42
2006/0289395 A1* 12/2006 Nomizu ................. G01R 31/58
219/109
(Continued)

FOREIGN PATENT DOCUMENTS

JP    2002-56726 A    2/2002
JP    2007-121099 A   5/2007
(Continued)

OTHER PUBLICATIONS

Notification of Reasons for Refusal for Japanese Patent Application No. 2020-164272 dated Oct. 4, 2022 and its English translation.
(Continued)

*Primary Examiner* — Jermele M Hollington
*Assistant Examiner* — Temilade S Rhodes-Vivour
(74) *Attorney, Agent, or Firm* — McCormick, Paulding & Huber PLLC

(57) ABSTRACT

A disconnection detecting system for detecting disconnection of any of a plurality of wires included in a cable is provided. The disconnection detecting system includes: a bending mechanism configured to periodically apply force to the cable so as to cause the cable to reciprocate between a first bending state to be bent in one direction of clockwise and counterclockwise directions and a second bending state to be bent in the other direction; and a measuring apparatus configured to measure a resistance value of the cable, which varies on a time series basis in accordance with the reciprocation of the bending mechanism, and extract a component of a bending frequency for reciprocating between the first and second bending states once from frequency components included in time-series variation in the resistance value of the cable. The disconnection is detected on a basis of amplitude of the component of the bending frequency.

16 Claims, 11 Drawing Sheets

(56) References Cited

U.S. PATENT DOCUMENTS

| | | | | |
|---|---|---|---|---|
| 2011/0319714 A1* | 12/2011 | Roelle | ............... | A61B 1/0051 |
| | | | | 600/118 |
| 2013/0222002 A1* | 8/2013 | Eshima | ............... | H01B 7/328 |
| | | | | 324/750.15 |
| 2013/0277087 A1* | 10/2013 | Hayakawa | .......... | B60R 16/0215 |
| | | | | 174/107 |
| 2014/0109655 A1* | 4/2014 | Eshima | ............... | G01M 3/221 |
| | | | | 73/40.7 |
| 2018/0203052 A1 | 7/2018 | Yamamoto | | |

FOREIGN PATENT DOCUMENTS

| | | |
|---|---|---|
| JP | 2007139488 A | 6/2007 |
| JP | 2012-068171 A | 4/2012 |
| JP | 2018-115992 A | 7/2018 |

OTHER PUBLICATIONS

Notification of Reasons for Refusal for Japanese Patent Application No. 2020-164272 dated Mar. 3, 2022 and its English Translation.

\* cited by examiner

1: DISCONNECTION DETECTING SYSTEM
20: BENDING MECHANISM
30: MEASURING APPARATUS
35 RESISTANCE MEASURING UNIT
36 FREQUENCY ANALYZING UNIT

40a: BENDING STATE
40b: BENDING STATE
ex. θ = 90°

FIG. 8
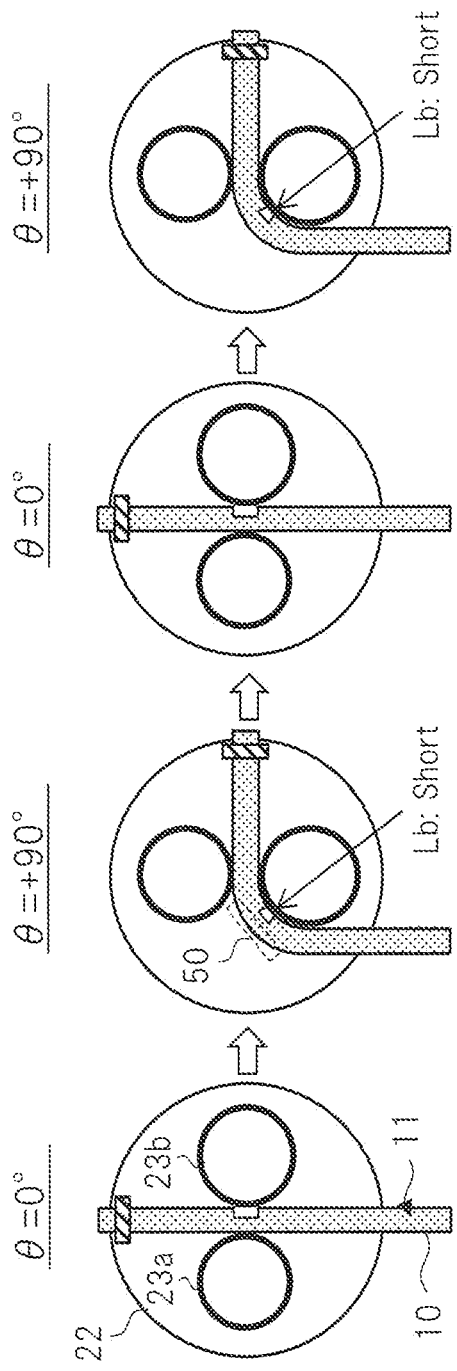
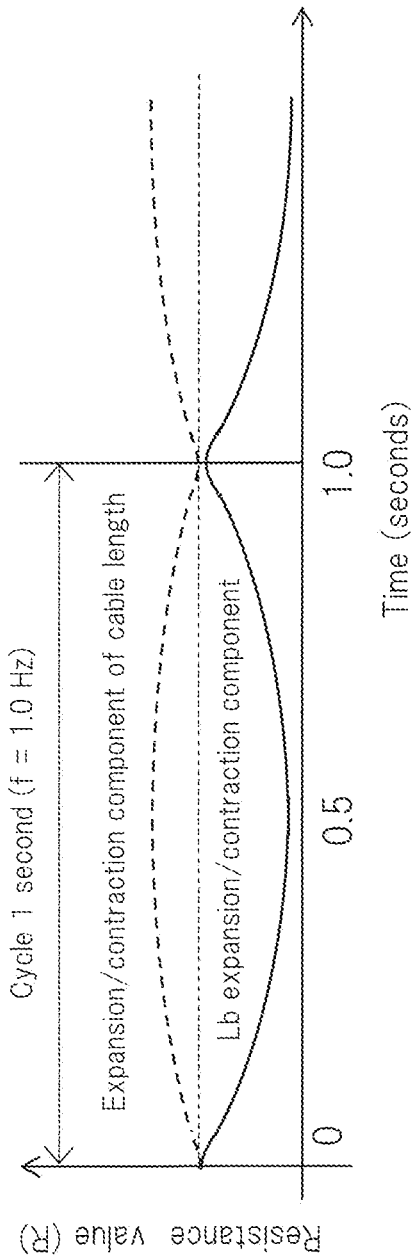

DISCONNECTION DETECTING SYSTEM AND DISCONNECTION DETECTING METHOD

CROSS-REFERENCE TO RELATED APPLICATION

The present application claims priority from Japanese Patent Applications No. 2020-60046 filed on Mar. 30, 2020 and No. 2020-164272 filed on Sep. 30, 2020, the content of which is hereby incorporated by reference into this application.

TECHNICAL FIELD OF THE INVENTION

The present invention relates to a disconnection detecting system and a disconnection detecting method, and more specifically, the present invention relates to a technique for detecting disconnection of a cable to be bent, for example.

BACKGROUND OF THE INVENTION

Japanese Patent Application Publication No. 2007-139488 (hereinafter, referred to as "Patent Document 1") discloses a method of detecting a sign of disconnection due to bending of a wire cable composed of a plurality of wires. Specifically, in this method, the wire cable is periodically bent and stretched toward one direction in a state where a current is flowing therethrough, and a current component that varies in synchronization with this bending cycle is detected. Namely, in this method, a state where some of disconnected portions repeat contact and separation in synchronization with the bending cycle is detected.

SUMMARY OF THE INVENTION

Disconnection of strand wire in a cable to be bent is generally detected by measuring an electric resistance of the strand wire in the cable. Specifically, when disconnection occurs in some of wires in the strand wire, a resistance value increases. For this reason, for example, by measuring an initial resistance value of the strand wire in advance in a state where disconnection has not occurred, it is possible to detect the disconnection on the basis of an increase rate from the initial resistance value.

However, in a case where disconnection occurs in a very small part of a wire in the strand wire, the increase rate of the resistance value becomes extremely small. For this reason, practically, unless a rate of the number of disconnected wires reaches a level of at least 50% or more in the wires in the strand wire, for example, it may be difficult to clearly detect disconnection on the basis of the increase rate of the resistance value. As a result, it is not easy to detect disconnection at an initial stage immediately after the disconnection occurs, and there is a possibility that the disconnection cannot be detected with high sensitivity.

Therefore, for example, as disclosed in Patent document 1, a method of detecting a current component that varies in synchronization with a bending cycle while bending and stretching a cable toward one direction is considered. However, in a case where the cable is bent and stretched toward the one direction in this manner, a resistance value may also vary depending upon a shape change accompanying bending and stretching. For this reason, even in a case where disconnection does not occur, a fluctuation component of the resistance value in synchronization with the bending cycle can be detected. Therefore, it becomes difficult to clearly distinguish a case where disconnection occurs, and there is a possibility that the disconnection cannot be detected with high sensitivity.

The present invention has been made in view of the above, and it is one of objects of the present invention to provide a disconnection detecting system and a disconnection detecting method capable of detecting disconnection of a wire in a cable with high sensitivity.

The foregoing and other objects, and new features of the present invention will become more apparent from the detailed description of the present specification and the appending drawings.

According to one embodiment, there is provided a disconnection detecting system for detecting disconnection of any of a plurality of wires included in a cable. The disconnection detecting system includes a bending mechanism and a measuring apparatus. The bending mechanism is configured to periodically apply force to the cable so as to cause the cable to reciprocate between a first bending state and a second bending state. The first bending state is a state where the cable is bent in one direction of a clockwise direction or counterclockwise direction, and the second bending state is a state where the cable is bent in the other direction. The measuring apparatus is configured to measure a resistance value of the cable. The resistance value varies on a time series basis in accordance with the reciprocation of the bending mechanism. The measuring apparatus is further configured to extract a component of a bending frequency from frequency components included in time-series variation in the resistance value of the cable. The bending frequency is a frequency to reciprocate between the first bending state and the second bending state once. Then, the disconnection detecting system detects disconnection on a basis of amplitude of the component of the bending frequency extracted by the measuring apparatus.

When an outline of representative invention of the present invention disclosed in the present application will briefly be explained, it becomes possible to detect disconnection of a wire in a cable with high sensitivity.

BRIEF DESCRIPTIONS OF THE DRAWINGS

The foregoing and other objects, features and advantages of the present invention will become more readily apparent from the following detailed description of embodiments of the present invention that proceeds with reference to the appending drawings:

FIG. 8 is a view for explaining one example of another effect by using the measurement principle of FIG. 5;

Figure 13:
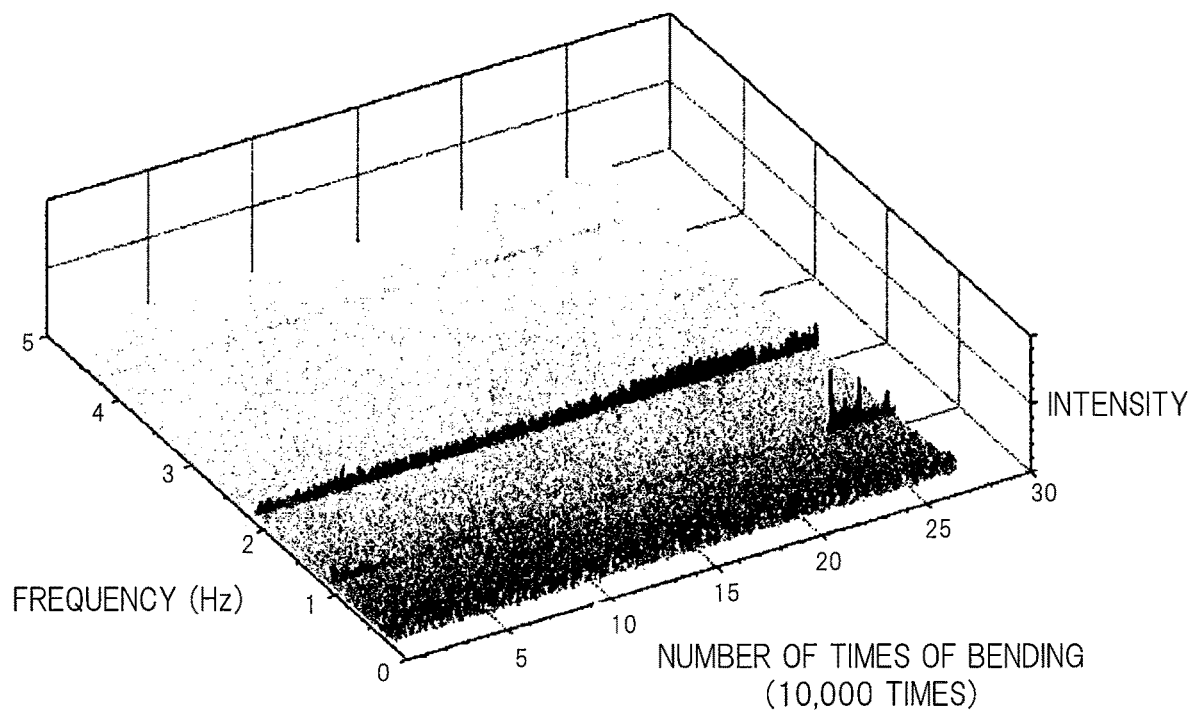
Figure 14:
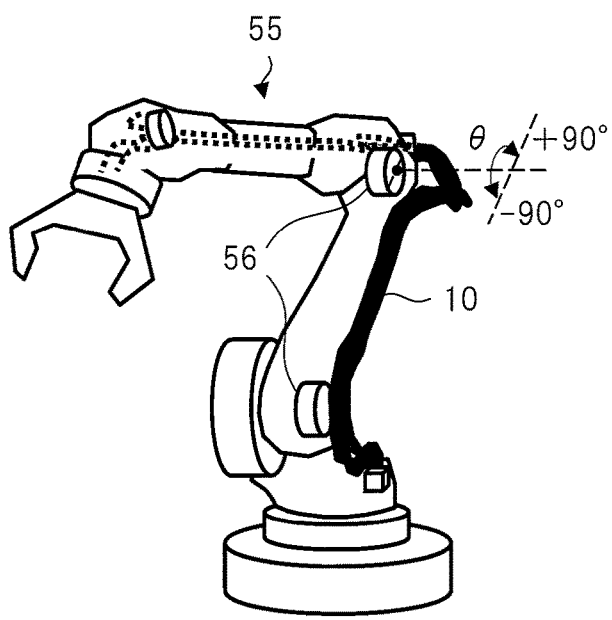

FIG. 13 is a view illustrating one example of a result obtained by executing disconnection detection of a cable by using the disconnection detecting method according to the second embodiment of the present invention; and FIG. 14 is a schematic view illustrating an example of the application to an industrial robot in a disconnection detecting system according to a third embodiment of the present invention.

DESCRIPTIONS OF EMBODIMENTS

Hereinafter, embodiments of the present invention will be described in detail with reference to the drawings. Note that in all of the drawings for describing the embodiments, the same reference numerals are applied to the same members in principle, and the repeated description thereof will be omitted.

First Embodiment

<Configuration of Disconnection Detecting System>

Figure 1A:
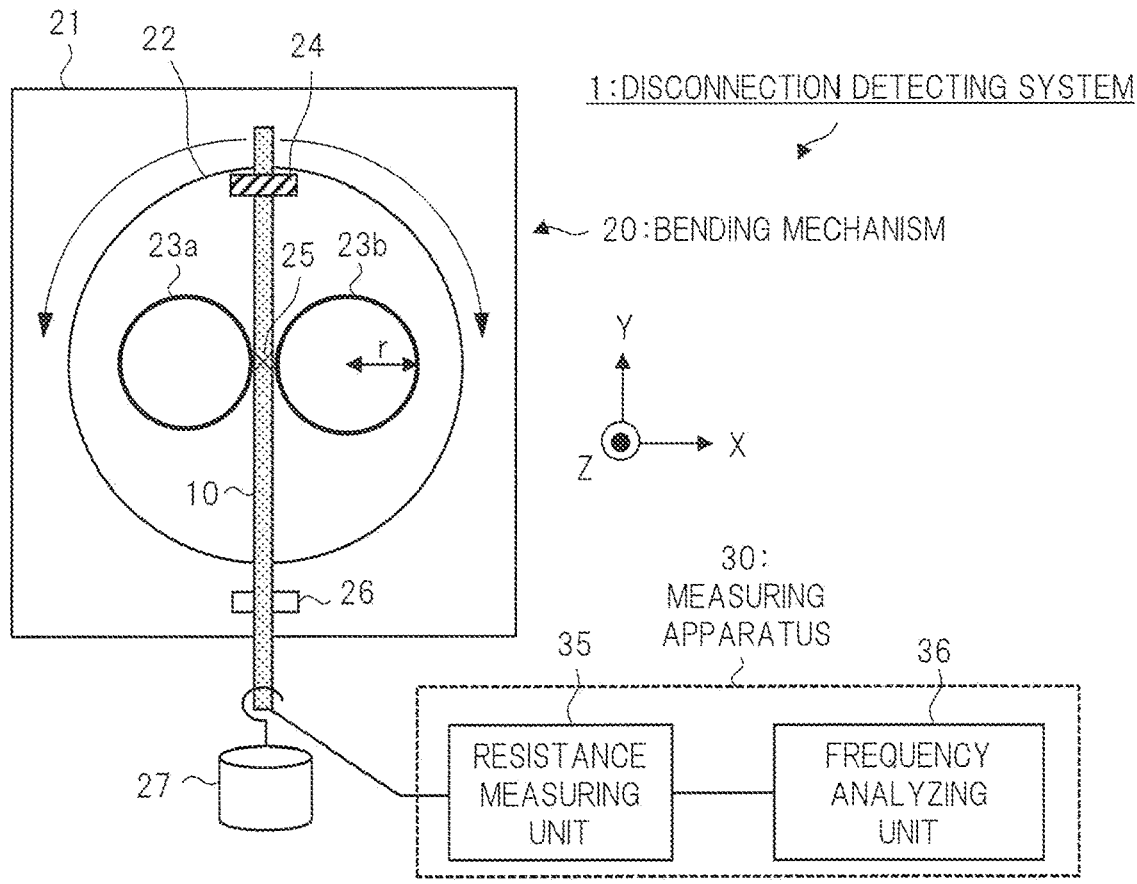
FIG. 1A is a schematic view illustrating a configuration example of a disconnection detecting system according to a first embodiment of the present invention.
Figure 1B:
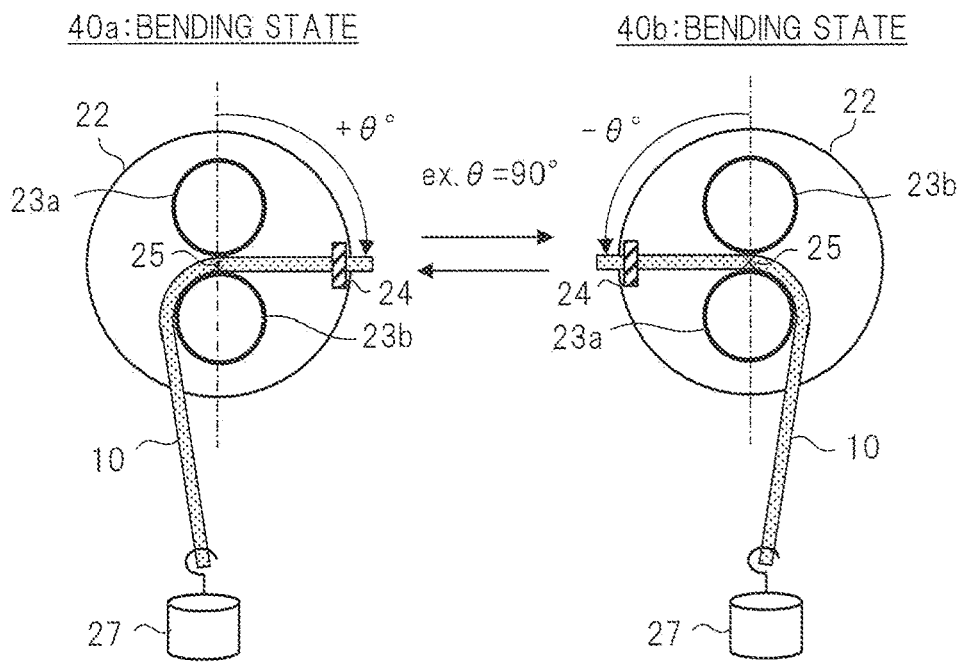
FIG. 1B is a schematic view for explaining an operation example of a bending mechanism illustrated in FIG. 1A.
Figure 2:
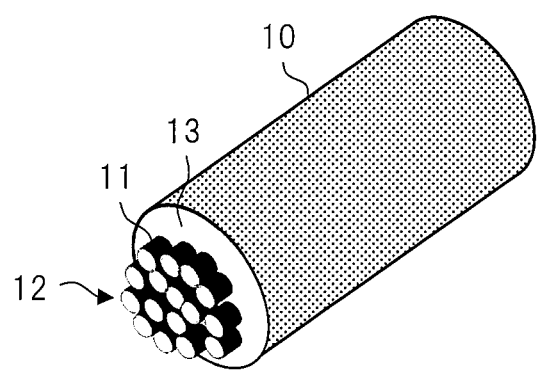
FIG. 2 is a perspective view illustrating a schematic configuration example of a cable illustrated in FIG. 1A.

FIG. 1A is a schematic view illustrating a configuration example of a disconnection detecting system according to a first embodiment of the present invention, and FIG. 1B is a schematic view for explaining an operation example of a bending mechanism illustrated in FIG. 1A. FIG. 2 is a perspective view illustrating a schematic configuration example of a cable illustrated in FIG. 1A. A cable 10 illustrated in FIG. 2 includes a plurality of wires 11. The plurality of wires 11 is conductors typified by copper wires, and is usually twisted with each other to constitute a strand wire 12. Further, the strand wire 12 is covered with an insulator 13. Note that the cable 10 is not limited such a configuration, and may have any of various configurations so long as the cable 10 includes at least the plurality of wires 11.

A disconnection detecting system 1 illustrated in FIG. 1A is a system for detecting that at least disconnection occurs in the plurality of wires 11 included in the cable 10. The disconnection detecting system 1 includes a bending mechanism 20 and a measuring apparatus 30. As illustrated in FIG. 1B, the bending mechanism 20 applies constant force to the cable 10 at a constant cycle so that the cable 10 reciprocates between a bending state 40a and a bending state 40b. The bending state 40a is a state where the cable 10 is bent in one direction of a clockwise direction and a counterclockwise direction (in this example, the clockwise direction). The bending state 40b is a state where the cable 10 is bent in the other direction of the clockwise direction and the counterclockwise direction (in this example, the counterclockwise direction).

For example, a bending angle θ in the bending state 40a and the bending state 40b is an arbitrary value in a range of 45° to 135°, and is 90° in this example. Further, if a frequency to reciprocate between the bending state 40a and the bending state 40b once is a bending frequency f, the bending frequency f is 0.5 Hz or the like (in other words, a bending cycle is two seconds), for example. In this case, the bending mechanism 20 repeats an operation to shift from the bending state 40a to the bending state 40b for one second, and then to return from the bending state 40b to the bending state 40a for one second. Along with this, the number of times of bending becomes two times for each bending cycle. Note that the bending frequency f may be set to an appropriate value in consideration of a usage condition, a bending speed, and the like of the cable 10 in actual use.

Specifically, the bending mechanism 20 includes a rotary member 22, two bending members 23a and 23b, a fixing member 24, and a guide member 26. The rotary member 22 is mounted on a base member 21. The two bending members 23a and 23b and the fixing member 24 are fixedly installed on the rotary member 22. The guide member 26 is fixedly installed on the base member 21. For example, the rotary member 22 is mounted on the base member 21 via a shaft member extending in a Z axis direction (not illustrated in the drawings). In an XY plane that is a surface direction of the rotary member 22, the rotary member 22 is movable around a central point 25 through which the shaft member is provided in each of the clockwise direction and the counterclockwise direction.

When the cable 10 in a stretching state is mounted on the rotary member 22 so as to pass through the central point 25, the bending member 23a and the bending member 23b are installed on the rotary member 22 so as to sandwich the cable 10 therebetween at the central point 25 on the XY plane. The fixing member 24 is installed on the rotary member 22 so as to fix the cable 10 in the stretching state to the rotary member 22 at a predetermined position different from the central point 25.

The guide member 26 is installed on the base member 21 so as to sandwich the cable 10 in the stretching state at a position facing the fixing member 24 with respect to the central point 25 on the XY plane. Further, in this example, a weight 27 for applying a load to the cable 10 in a stretching direction is attached to an end of the cable 10 on the guide member 26 side. The view illustrating weight 27 is 50 g, for example. However, the weight 27 may be set to an appropriate value in consideration of a weight by which the cable 10 is bent along the bending members 23a and 23b with a predetermined radius (hereinafter, referred to as a "bending radius") r and a load applied to the cable 10 in the stretching direction in actual use.

Here, for example, as illustrated in FIG. 1B, it is assumed that reciprocating motion between the bending state 40a and the bending state 40b is carried out by using a bending angle θ of 90° and a bending frequency f of 0.5 Hz. In this case, the bending mechanism 20 may rotationally drive the shaft member (not illustrated in the drawings) at the central point 25 in both directions at a rotation speed of 30 rpm by using a motor (not illustrated in the drawings).

Further, it is desirable that at least a portion abutting on the cable 10 of each of the bending members 23a and 23b is formed in an arc shape so as to bend the cable 10 with the predetermined radius (the bending radius) r when the rotary member 22 is moved along with this rotary drive. This makes it possible to stabilize conditions when the cable 10 is bent together with the bending angle θ. In addition, it becomes possible to apply force to a portion to be bent uniformly to an extent. Note that the bending radius r is about 10 mm in this example.

The measuring apparatus 30 measures a resistance value of the cable 10 (the plurality of wires 11), which varies on a time series basis in accordance with the reciprocating motion of the bending mechanism 20, and extracts a component of the bending frequency f (for example, 0.5 Hz) described above from frequency components included in time-series variation in the resistance value of the cable 10. Then, the disconnection detecting system 1 detects disconnection of the cable 10 on the basis of amplitude of this component of the bending frequency f extracted by the measuring apparatus 30.

Specifically, the measuring apparatus 30 includes a resistance measuring unit 35 and a frequency analyzing unit 36. For example, the resistance measuring unit 35 measures a current flowing therethrough on a time series basis while applying a constant voltage between both ends of the cable 10, or measures a voltage generated between the both ends of the cable 10 on a time series basis while supplying a constant current to the cable 10, thereby measuring a variation in the resistance value of the cable 10 (specifically, the plurality of wires 11 illustrated in FIG. 2). The frequency analyzing unit 36 extracts the component of the bending frequency f from the frequency components included in the time-series variation in the resistance value of the view illustrating cable 10. Note that further details of the measuring apparatus 30 will be described later.

<Bending Life Characteristics of Cable and Problems That Become Premise>

Figure 3:
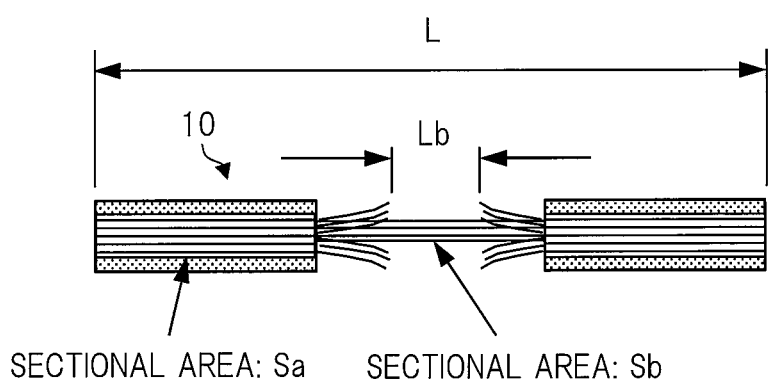
FIG. 3 is a schematic view for explaining a theoretical resistance value in a case where disconnection occurs in the cable illustrated in FIG. 2.

FIG. 3 is a schematic view for explaining a theoretical resistance value in a case where disconnection occurs in the cable illustrated in FIG. 2. In a case where disconnection occurs in the cable 10, a resistance value R [Ω] of the cable 10 theoretically represented by a formula (1). In the formula (1), ρ [Ω·m] is a resistivity of the wire 11, and La [m] is a conductor length of a non-disconnected portion. The La [m] is represented by a formula (2) using a cable length L [m] and a conductor length Lb [m] of a disconnected portion illustrated in FIG. 3. Further, Sa [m²] is a conductor sectional area of the non-disconnected portion, and Sb [m²] is a conductor sectional area of the disconnected portion.

$$R=\rho \times (La/Sa) + \rho \times (Lb/Sb) \quad (1)$$

$$La = L - Lb \quad (2)$$

As indicated by the formula (1), the resistance value R of the cable 10 has a characteristic that is inversely proportional to the sectional area Sb of the disconnected portion. In this case, when the sectional area Sb is large to an extent, the resistance value R does not vary so much, and the resistance value R increases rapidly at a stage where the sectional area Sb becomes sufficiently small. As a result, in a case where a ratio of the number of disconnected wires 11 is small, the sectional area Sb is sufficiently large. Therefore, the resistance value R does not vary so much. Further, as one example, the sectional area Sb becomes sufficiently small at a stage where the ratio of the number of disconnected wires 11 reaches about 70% to 80%, and the resistance value R can increase by about 20% from an initial resistance value.

Figure 4:
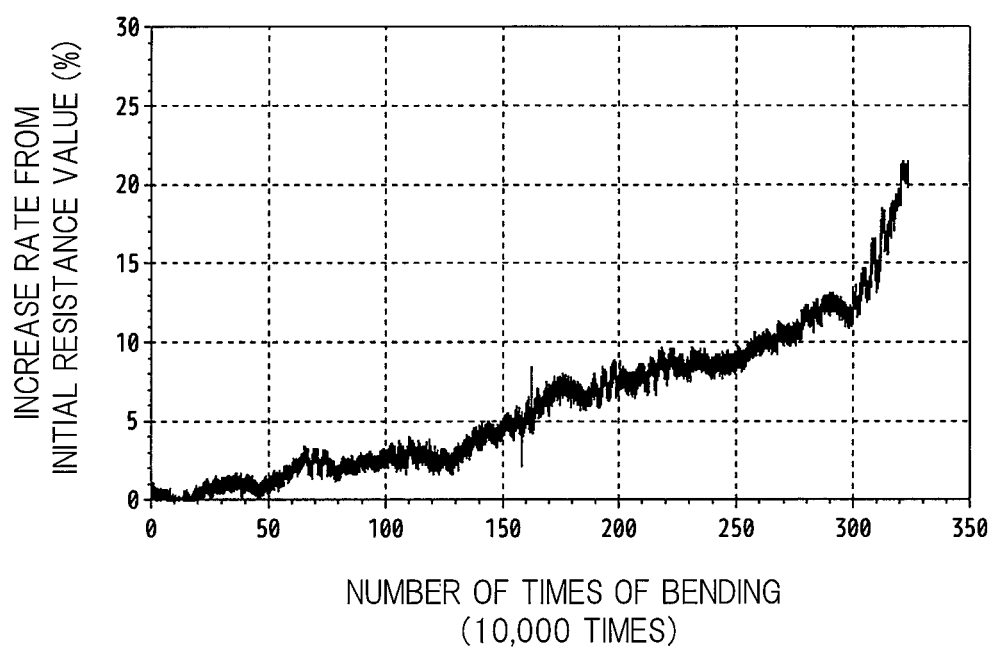
FIG. 4 is a graph illustrating a characteristic example of a bending life of the cable illustrated in FIG. 2.

FIG. 4 is a graph illustrating a characteristic example of a bending life of the cable illustrated in FIG. 2. In this example, a type of the cable 10 is that an insulator thereof is made of ETFE and a conductor thereof is made by twisting 40 wires of 80 μm, which is equivalent to a 25 AWG wire. In FIG. 4, the resistance value R of the cable 10 gradually increases in a region where the number of times of bending is 3 million or less, and rapidly increases at a stage where the number of times of bending exceeds 3 million. Here, for example, a portion where the number of times of bending is about 3 million in FIG. 4 corresponds to a portion where the ratio of the number of disconnected wires 11 reaches about 70% to 80%. On the other hand, the region where the number of times of bending is 3 million or less is a region where initial disconnection (slight disconnection) occurs at any portion in the region and the ratio of the number of disconnected wires 11 increases as the number of times of bending increases.

Here, it is assumed that a general detecting method of simply detecting disconnection on the basis of an increase rate from the initial resistance value is used. In this case, as can be seen from FIG. 4, it is difficult to determine when the initial disconnection occurred. As described above, as its main reason, it can be cited that not only the resistance value R does not vary significantly until the ratio of the number of disconnected wires becomes sufficiently large, but also the resistance value R may vary depending upon environmental temperature or contact potential at the time of measuring the resistance value R. For example, if a temperature characteristic of the resistance value R is about 0.4%/° C. and the environmental temperature increases by 20° C., the resistance value R increases by about 8%.

Therefore, in order to detect the initial disconnection, if it is determined that there is disconnection using a small increase rate in FIG. 4 (for example, a value of 10% or lower) as a threshold value, false detection cannot be ignored. In order to prevent the false detection, it is necessary to set the threshold value to an increase rate of about 20%, for example. However, at this threshold value, the ratio of the number of disconnected wires has already become large to about 70% to 80%, for example. Thus, in the general detecting method, it is difficult to detect the initial disconnection. In other words, it is difficult to detect the disconnection with high sensitivity. Therefore, it is beneficial to use the disconnection detecting system 1 illustrated in FIG. 1A and FIG. 1B.

<Details of Measuring Method>

Figure 5:
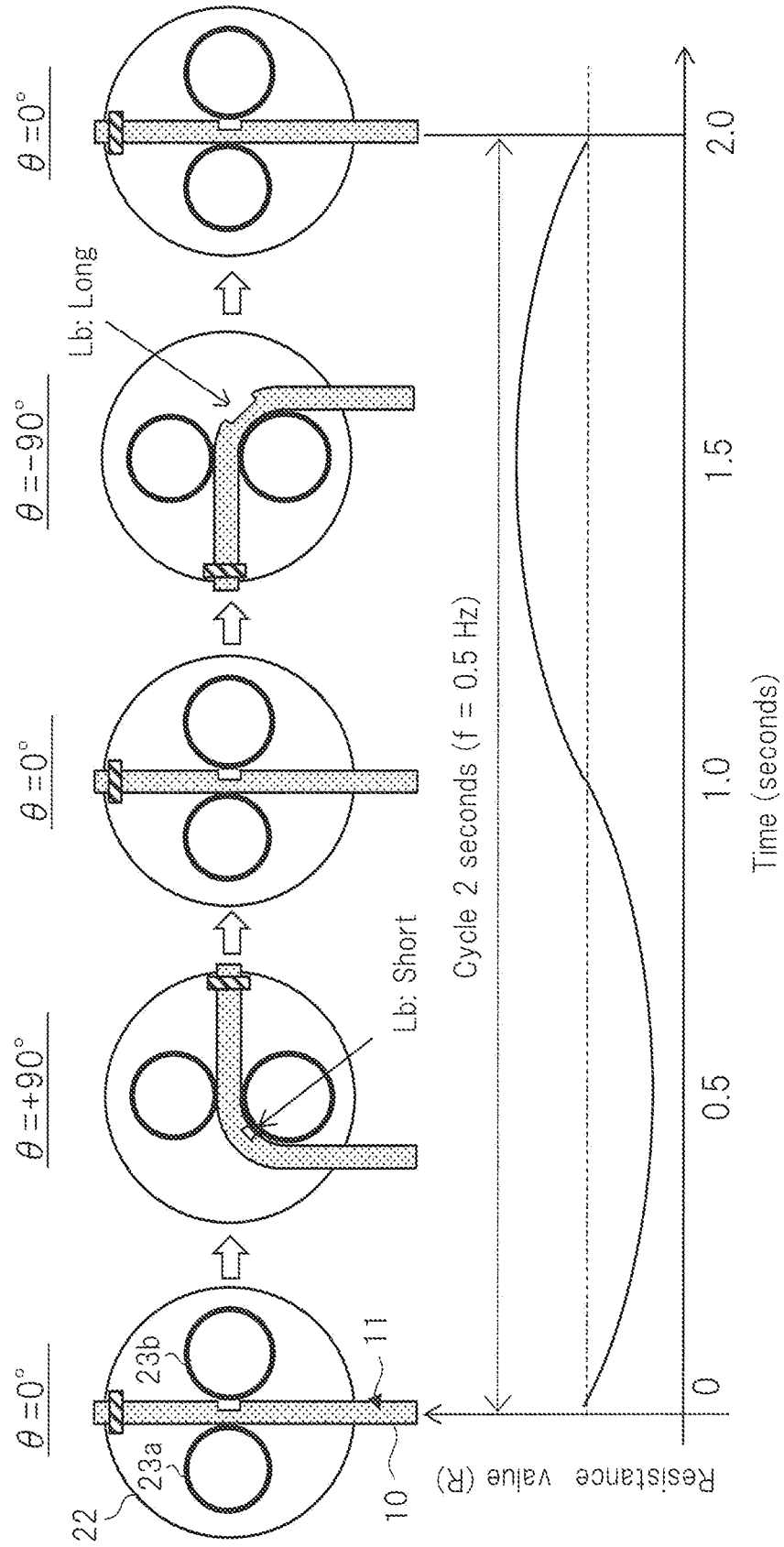
FIG. 5 is a schematic view for explaining a measurement principle of a cable resistance value in case of using the disconnection detecting system illustrated in FIG. 1A and FIG. 1B.

FIG. 5 is a schematic view for explaining a measurement principle of a cable resistance value in case of using the disconnection detecting system illustrated in FIG. 1A and FIG. 1B. In the example illustrated in FIG. 5, disconnection occurs at a part of the bending member 23b side in the plurality of wires 11 included in the cable 10. FIG. 5 illustrates the resistance value R of the cable 10 in a case where the rotary member 22 is caused to reciprocate in a range of the bending angle θ from +90° to −90° on the premise of such a disconnection state. Note that the bending frequency f is 0.5 Hz.

As illustrated in FIG. 5, in a case where the bending angle θ is +90°, the conductor length Lb of the disconnected portion becomes shorter compared with a case where the bending angle θ is 0°. The resistance value R in the formula (1) decreases along with this. On the other hand, in a case where the bending angle θ is −90°, the conductor length Lb of the disconnected portion becomes longer compared with a case where the bending angle θ is 0°. The resistance value R in the formula (1) increases along with this. Thus, the conductor length Lb of the disconnected portion periodically expands and contracts in a length direction of the cable 10 in synchronization with the reciprocating motion of the rotary member 22. As a result, the resistance value R of the cable 10 is modulated by the bending frequency f. On the other hand, in a case where disconnection does not occur, any component that varies with the bending frequency f is not included in the variation in the resistance value R ideally.

Therefore, the measuring apparatus 30 measures the resistance value of the cable 10, which varies on the time series basis in accordance with the reciprocating motion of the bending mechanism 20, and extracts the component of the bending frequency f from the frequency components included in the time-series variation in the resistance value of the am cable 10. This makes it possible to regard a time when the component of the bending frequency f is generated as a time when initial disconnection occurs. Namely, from a different point of view, it becomes possible to detect that at least disconnection including the initial disconnection occurs at each time point on the basis of whether the component of the bending frequency f is generated or not (for example, whether the amplitude of the component is equal to or greater than a threshold value or not).

Figure 6:
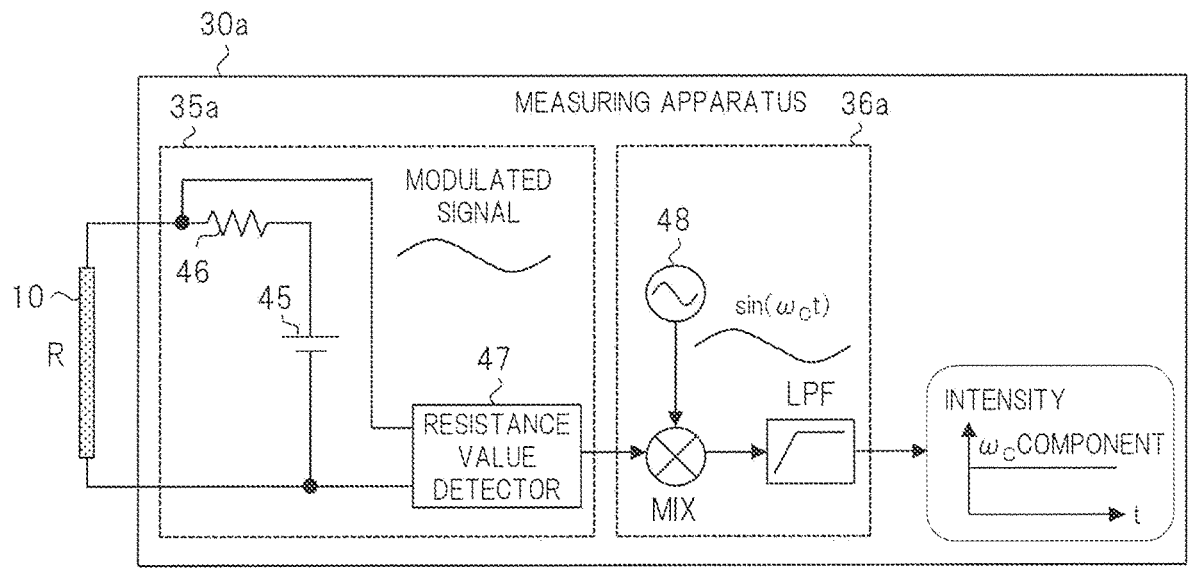
FIG. 6 is a view illustrating a schematic configuration example and an operation example of the measuring apparatus illustrated in FIG. 1A.

FIG. 6 is a view illustrating a schematic configuration example and an operation example of the measuring apparatus illustrated in FIG. 1A. A measuring apparatus 30a illustrated in FIG. 6 has a configuration example in which a lock-in amplifier configured to detect a component of specific frequency from a measurement signal is provided. A measuring apparatus 30a illustrated in FIG. 6 includes a resistance measuring unit 35a and a frequency analyzing unit 36a. For example, the resistance measuring unit 35a includes a DC signal source (for example, a DC constant voltage source) 45, an input resistance 46, and a resistance value detector 47, and the like. Note that in a case where a DC constant current source is used as the DC signal source 45, the input resistance 46 is not required.

The DC signal source 45 applies a DC signal (here, a DC voltage) to the cable 10 via the input resistance 46. In accordance with this, a modulated signal (for example, a voltage signal) including the component of the bending frequency f (=0.5 Hz) as illustrated in FIG. 5 is outputted from the cable 10. The resistance value detector 47 detects the time-series variation in the resistance value R of the cable 10 by amplifying this modulated signal with a predetermined gain, for example.

For example, the frequency analyzing unit 36a includes a carrier signal generator 48, a mixer MIX, a low-pass filter LPF, and the like. The carrier signal generator 48 generates a carrier signal having the bending frequency f, that is, a carrier signal ($\omega_C$=0.5 Hz) that is the same as a resistance value varying frequency due to disconnection and has the same phase as that of the resistance value varying frequency. The mixer MIX multiplies this carrier signal by an output signal from the resistance value detector 47 (in other words, synchronous detection), thereby outputting a signal obtained by superimposing a signal with a DC component and a signal with a "2× $\omega_C$" component.

The low-pass filter LPF receives a signal outputted from the mixer MIX to block the signal with the "2×$\omega_C$" component and cause the signal with the DC component to pass therethrough. This signal with the DC component indicates amplitude of the component of the bending frequency f (=$\omega_C$). Thus, a configuration to detect a component of a predetermined frequency (here, the bending frequency f) by using the carrier signal generator 48, the mixer MIX, and the low-pass filter LPF is a basic configuration of the lock-in amplifier.

Figure 7:
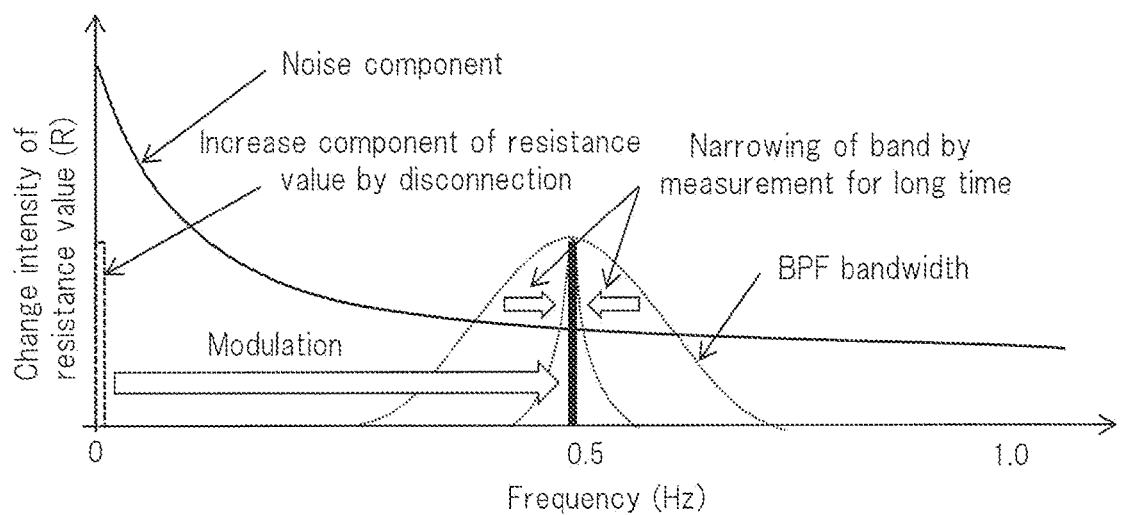
FIG. 7 is a view for explaining one example of effects by using the measurement principle of FIG. 5.

FIG. 7 is a view for explaining one example of effects by using the measurement principle of FIG. 5. In FIG. 7, for example, in a case where the general detecting method described above is used, an increase component of the resistance value R due to disconnection is generated at a DC frequency (=0 Hz). However, generally, the lower the frequency becomes, the more a noise component (for example, a variation component depending upon temperature at the time of measurement, the contact potential, or the like, that is, 1/f noise due to amplification by a semiconductor device or the like) increases. For this reason, in the general detecting method, it may become difficult to distinguish the increase component of the resistance value R from the noise component unless the increase component of the resistance value R becomes large (for example, unless the degree of disconnection proceeds). In other words, a measured result may be greatly influenced by measurement environment that causes the noise component.

On the other hand, when the method as illustrated in FIG. 5 is used, a varied component of the resistance value R due to disconnection is generated at the bending frequency f (=0.5 Hz). At the bending frequency f (=0.5 Hz), the noise component becomes smaller compared with the DC frequency (=0 Hz). For this reason, even in a case where the varied component of the resistance value R is small to an extent (that is, even in a case where it is in an initial disconnection state), it becomes possible to distinguish the varied component of the resistance value R from the noise component. In other words, the measured result is hardly influenced by the measurement environment.

Further, the configuration using the lock-in amplifier as illustrated in FIG. 6 is equivalent to a configuration in which the modulated signal from the cable 10 (actually, including the noise component in addition to the component of the bending frequency f) is caused to pass through a bandpass filter (BPF) that uses the bending frequency f as a central frequency. At this time, by securing a measurement time to an extent, it is possible to effectively narrow a bandwidth of this bandpass filter (BPF). This means that time constant of the low-pass filter LPF illustrated in FIG. 6 can be designed to be large. Then, as the bandwidth of the bandpass filter (BPF) is narrowed, it where possible to further reduce influence of the noise component (in other words, it is possible to improve an SN ratio).

Note that the configuration example illustrated in FIG. 6 is one in which the DC signal is applied to the cable 10, but is not limited to the DC signal. It may be one that applies an AC signal with a predetermined frequency to the cable 10 by using an AC signal source (for example, about 10 kHz). In this case, a signal as if the amplitude of this AC signal was modulated with a modulated signal of the bending frequency f is outputted from the cable 10. Therefore, by multiplying this output signal by the carrier signal with the same frequency as that of the AC signal of the AC signal source using the mixer MIX, it is possible to demodulate the modulated signal of the bending frequency f. When such a method is used, the measurement at a higher frequency (for example, about 10 kHz) can be carried out, and as a result, the influence of the noise component hardly occurs.

Further, the configuration of the measuring apparatus 30 illustrated in FIG. 1A is not limited to the configuration using the lock-in amplifier as illustrated in FIG. 6. For example, the configuration may be a configuration in which the component of the bending frequency f is extracted by using an actual bandpass filter (BPF). Moreover, for example, the configuration of the measuring apparatus 30 may be a configuration in which the output signal from the resistance value detector 47 illustrated in FIG. 6 is converted into a digital signal and the component of the bending frequency f is extracted by executing digital processing such as fast Fourier transform (FFT) to the digital signal.

Figure 9:
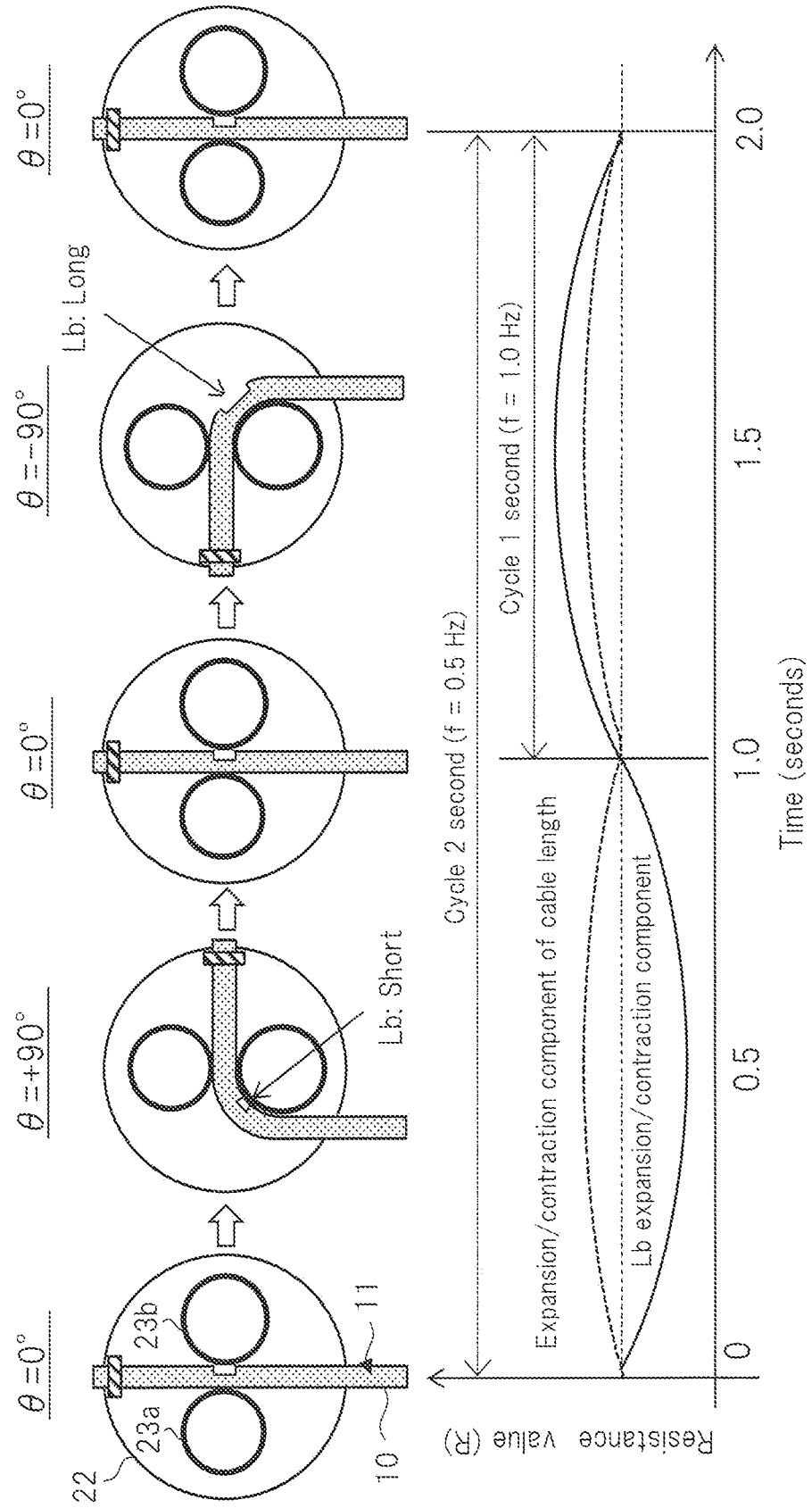
FIG. 9 is a view for explaining one example of still another effect by using the measurement principle of FIG. 5.

FIG. 8 and FIG. 9 are views illustrating one example of other effects by using the measurement principle of FIG. 5. Unlike the case of FIG. 5, but similar to the case of Patent document 1, FIG. 8 illustrates a state of variation in the resistance value R when the cable 10 is caused to reciprocate in a range of 0° to +90° of the bending angle θ. In this case, as illustrated in FIG. 8, the bending frequency f becomes 1.0 Hz (and the bending cycle is one second), and the component of the bending frequency f (1.0 Hz) is generated as the varied component of the resistance value R accompanying variation in the conductor length Lb of the disconnected portion.

On the other hand, more specifically, when the cable 10 is bent, an outer peripheral portion 50 of a bent portion of the cable 10 is temporarily stretched particularly. Namely, the cable length of the cable 10 is temporarily increased. For this reason, more specifically, as illustrated in a broken line of FIG. 8, the resistance value R of the cable 10 varies at 1.0 Hz due to expansion and contraction of this cable 10 even in a case where disconnection does not occur.

As a result, as illustrated in FIG. 8, in a case where the cable 10 is bent in only one direction of the clockwise direction and the counterclockwise direction, it becomes difficult to distinguish a frequency component (a component of 1.0 Hz) due to the expansion and contraction of the cable 10 from a frequency component (a component of 1.0 Hz) due to variation in the conductor length Lb of the disconnected portion. On the other hand, as illustrated in FIG. 9, in a case where the cable 10 is bent in both directions of the clockwise direction and the counterclockwise direction, it is possible to clearly distinguish the frequency component (the component of 1.0 Hz) due to the expansion and contraction of the cable 10 from a frequency component (a component of 0.5 Hz) due to variation in the conductor length Lb of the disconnected portion.

Further, if the bending is continued in a state where disconnection occurs in the cable 10, the cable 10 may change from a state where disconnection parts (on a fracture surface) touch or are separated at the disconnected portion to a state where a distance between both ends of the disconnection parts (that is, an interval on the fracture surface) merely varies to a small degree while the disconnection parts are separated. In the method according to the first embodiment, only the frequency component accompanying the variation in the conductor length Lb of the disconnected portion is extracted and evaluated. Therefore, it is possible to detect minute variation in the resistance value due to a minute change in the distance between the both ends of the disconnection parts.

<Actual Measurement Result>

Figure 10:
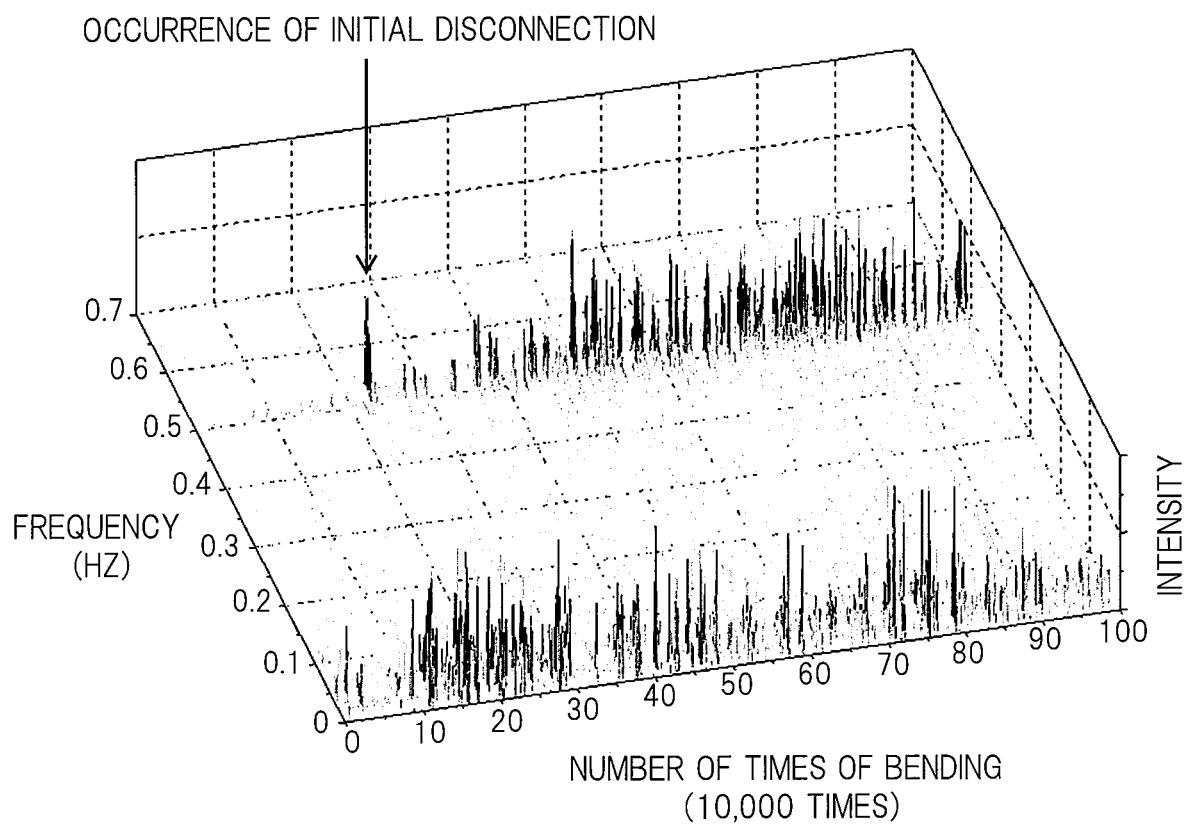
FIG. 10 is a view illustrating one example of a result obtained by executing disconnection detection of the cable having the characteristic illustrated in FIG. 4 using the disconnection detecting system illustrated in FIG. 1A and FIG. 1B.

FIG. 10 is a view illustrating one example of a result obtained by executing disconnection detection of the cable having the characteristic illustrated in FIG. 4 using the disconnection detecting system illustrated in FIG. 1A and FIG. 1B. A vertical axis of FIG. 10 indicates the intensity of the signal with the DC component outputted from the low-pass filter LPF. Similar to the case of FIG. 4, a type of the cable 10 is "ETFE standard core, TA line, 25 AWG 40/0.08", and a length of the cable 10 is 2 m. Further, with respect to the actual measurement conditions, the bending radius r illustrated in FIG. 1A is 10 mm, the bending angle θ is 90°, the weight 27 is 50 g, and the rotation speed of the motor at the time of bending is 30 rpm. Note that the characteristic example illustrated in FIG. 4 is also actually measured values obtained under the same conditions as those of FIG. 10.

As illustrated in FIG. 10, the component of the bending frequency f (=0.5 Hz) is clearly detected in a region after the number of times of bending reaches about 220,000 times. For this reason, it is possible to estimate a time point when the number of times of bending reaches about 220,000 times as a time point when initial disconnection occurs. Namely, it was difficult to determine the time point when the initial disconnection occurred by the characteristic of the increase rate of the resistance value R as illustrated in FIG. 4. However, this determination is possible by using the method according to the first embodiment. Note that components in the vicinity of 0 Hz of frequency illustrated in FIG. 10 is noise.

<Disconnection Detecting Method>

Figure 11:
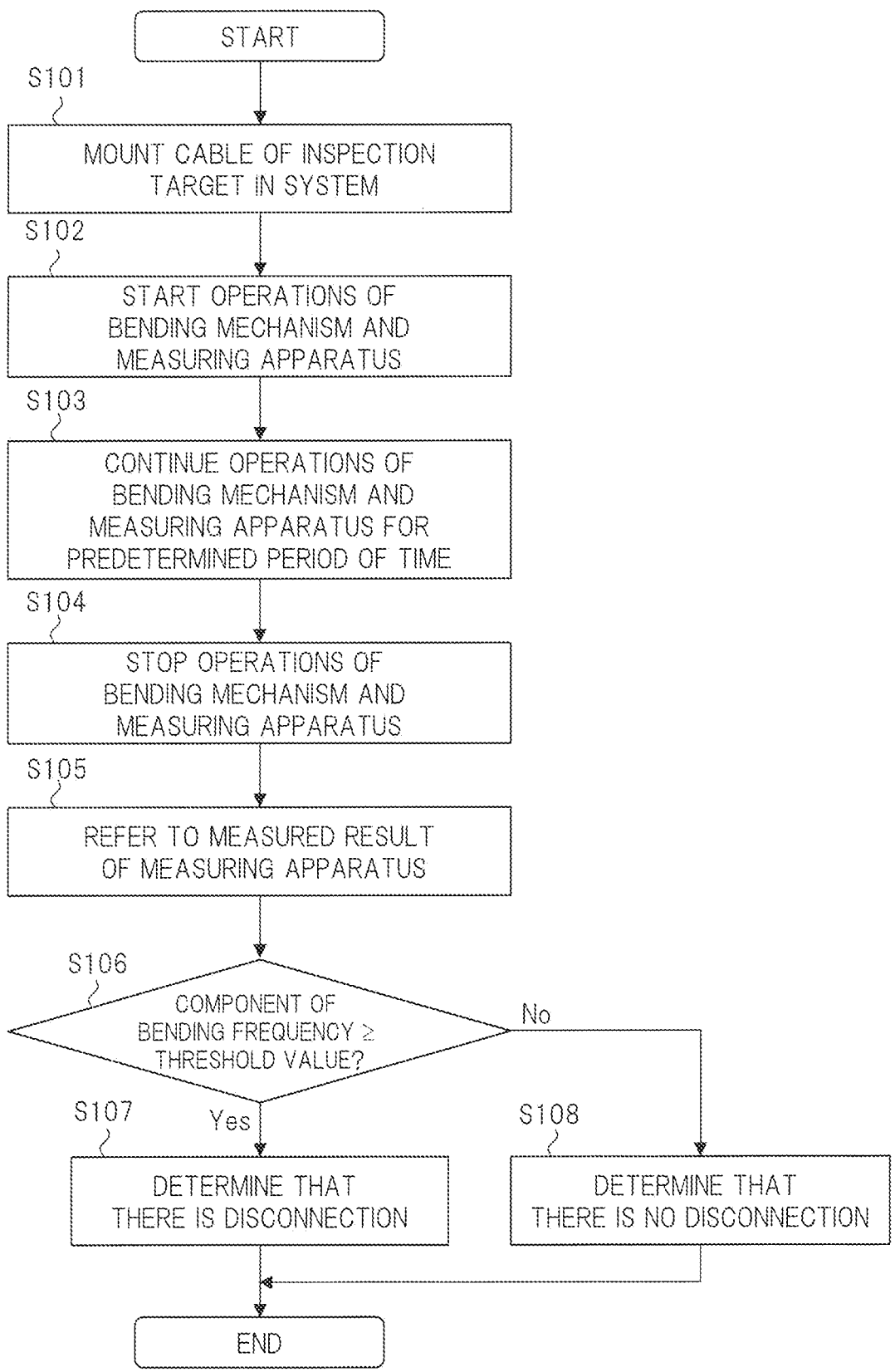
FIG. 11 is a flow diagram illustrating one example of the processing content in a disconnection detecting method according to the first embodiment of the present invention.

FIG. 11 is a flow diagram illustrating one example of the processing content in a disconnection detecting method according to the first embodiment of the present invention. First, at Step S101, a cable 10 that becomes an inspection target is mounted in the disconnection detecting system 1 illustrated in FIG. 1A. Subsequently, at Step S102, operations of the bending mechanism 20 and the measuring apparatus 30 illustrated in FIG. 1A are started. In accordance with this, as illustrated in FIG. 1B, the bending mechanism 20 periodically applies force to the cable 10 so as to cause the cable 10 to reciprocate between the bending state 40a and the bending state 40b. Further, during the reciprocation, the measuring apparatus 30 measures a resistance value of the cable 10, which varies on a time series basis, and extracts a component of a bending frequency f from frequency components included in such variation.

Subsequently, at Step S103, such operations of the bending mechanism 20 and the measuring apparatus 30 are continued for a predetermined period of time. For example, the predetermined period of time means a period of time that is required to certainly detect the component of the bending frequency f via the low-pass filter LPF in the configuration of the lock-in amplifier as illustrated in FIG. 6 in a case where the output signal from the cable 10 includes the component of the bending frequency f to an extent. In other words, it is a period of time required to detect the component of the bending frequency f in a case where a cycle modulated with the bending frequency f is not sporadic but occurs continuously to an extent. This predetermined period of time may be changed appropriately depending upon the configuration of the measuring apparatus 30, the measurement environment (that is, amplitude of the noise component), or the like.

Subsequently, at Step S104, the operations of the bending mechanism 20 and the measuring apparatus 30 are stopped. Then, a measured result of the measuring apparatus 30 is referred to (Step S105), and it is determined whether the component of the bending frequency f extracted by the measuring apparatus 30 is equal to or greater than a threshold value defined in advance or not (Step S106). Then, in a case where it is determined that the component of the bending frequency f is equal to or greater than the threshold value, it is determined that there is disconnection (Step S107). In a case where it is determined that the component of the bending frequency f is smaller than the threshold value, it is determined that there is no disconnection (Step S108).

Such a flow allows disconnection of the cable 10 including initial disconnection to be detected with the predetermined period of time at Step S103 as an inspection time.

Namely, it becomes possible to detect the disconnection in a sufficiently short inspection time. Note that at Step S107, it may be notified by an alarm system by sound or light that it is determined that there is disconnection.

Main Effect of First Embodiment

As described above, by using the disconnection detecting system and the disconnection detecting method according to the first embodiment, it typically becomes possible to detect disconnection of the wire 11 in the cable 10 including initial disconnection, and as a result, this makes it possible to detect the disconnection with high sensitivity. Specifically, it becomes possible to detect the initial disconnection that was difficult to detect by the general detecting method using the increase rate of the resistance value. Moreover, as mentioned in FIG. 8 and FIG. 9, unlike the method of Patent document 1, it is possible to detect the initial disconnection clearly (and thus with high sensitivity). As a result, in various kinds of systems in each of which the cable 10 is mounted, countermeasures can be taken before a serious failure (for example, almost total disconnection) occurs, and this makes it possible to improve reliability of the system.

Second Embodiment

A disconnection detecting system according to a second embodiment of the present invention will be described below.

Figure 12:
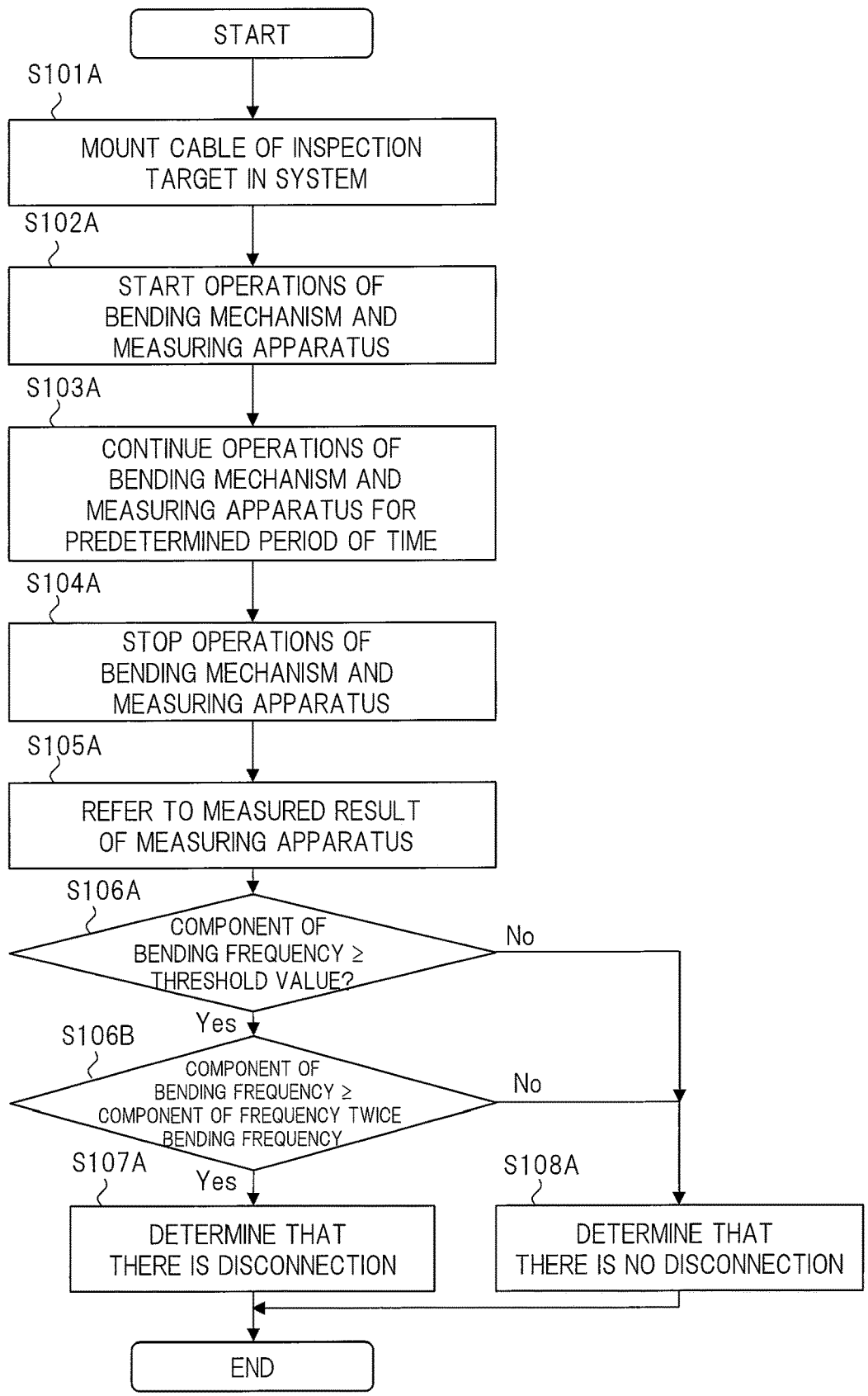
FIG. 12 is a flow diagram illustrating one example of the processing content in a disconnection detecting method according to a second embodiment of the present invention.

FIG. 12 is a flow diagram illustrating one example of the processing content in a disconnection detecting method according to the second embodiment of the present invention. First, at Step S101A, a cable 10 that becomes an inspection target is mounted in the disconnection detecting system 1 illustrated in FIG. 1A. Subsequently, at Step S102A, operations of the bending mechanism 20 and the measuring apparatus 30 illustrated in FIG. 1A are started. In accordance with this, as illustrated in FIG. 1B, the bending mechanism 20 periodically applies force to the cable 10 so as to cause the cable 10 to reciprocate between the bending state 40a and the bending state 40b. Further, during the reciprocation, the measuring apparatus 30 measures a resistance value of the cable 10, which varies on a time series basis, and extracts a component of a bending frequency f and a component of a frequency twice as much as the bending frequency f from frequency components included in such variation.

Subsequently, at Step S103A, such operations of the bending mechanism 20 and the measuring apparatus 30 are continued for a predetermined period of time. For example, the predetermined period of time means a period of time that is required to certainly detect the component of the bending frequency f and the component of the frequency twice as much as the bending frequency f via the low-pass filter LPF in the configuration of the lock-in amplifier as illustrated in FIG. 6 in a case where the output signal from the cable 10 includes the component of the bending frequency f and the component of the frequency twice as much as the bending frequency f to an extent. In other words, it is a period of time required to detect the component of the bending frequency f and the component of the frequency twice as much as the bending frequency f in a case where a cycle modulated with the bending frequency f is not sporadic but occurs continuously to an extent. This predetermined period of time may be changed appropriately depending upon the configuration of the measuring apparatus 30, the measurement environment (that is, amplitude of the noise component), or the like.

Subsequently, at Step S104A, the operations of the bending mechanism 20 and the measuring apparatus 30 are stopped. Then, a measured result of the measuring apparatus 30 is referred to (Step S105A), and it is determined whether the component of the bending frequency f extracted by the measuring apparatus 30 is equal to or greater than a threshold value defined in advance or not (Step S106A). In a case where it is determined at Step 106A that the component of the bending frequency f is equal to or greater than the threshold value, it is determined whether the component of the bending frequency f extracted by the measuring apparatus 30 is equal to or greater than the component of the frequency twice as much as the bending frequency f or not (Step S106B). In a case where it is determined at Step S106B that the component of the bending frequency f extracted by the measuring apparatus 30 is equal to or greater than the component of the frequency twice as much as the bending frequency f, it is determined that there is disconnection (Step S107A). In a case where it is determined at Step S106A that the component of the bending frequency f is smaller than the threshold value, it is determined that there is no disconnection (Step S108A). Further, in a case where it is determined at Step S106B that the component of the bending frequency f extracted by the measuring apparatus 30 is smaller than the component of the frequency twice as much as the bending frequency f, it is determined that there is no disconnection (Step S108A). Note that the order of Step S106A and Step S106B may be reversed.

Such a flow allows disconnection of the cable 10 including initial disconnection to be detected with the predetermined period of time at Step S103A as an inspection time. Namely, it becomes possible to detect the disconnection in a sufficiently short inspection time. Note that at Step S107A, it may be notified by an alarm system by sound or light that it is determined that there is disconnection.

<Actual Measurement Result>

FIG. 13 is a view illustrating one example of a result obtained by executing disconnection detection of a cable by using the disconnection detecting method according to the second embodiment of the present invention. A vertical axis of FIG. 13 indicates the intensity of a signal with a DC component outputted from the low-pass filter LPF. A type of a cable 10 is "ETFE standard core, TA line, 28 AWG 40/0.08", and a length of the cable 10 is 2 m. Further, with respect to the actual measurement conditions, the bending radius r illustrated in FIG. 1A is 10 mm, a bending angle θ is 90°, the weight 27 is 50 g, and the rotation speed of the motor at the time of bending is 60 rpm. Note that the characteristic example illustrated in FIG. 4 is also actually measured values obtained under the same conditions as those of FIG. 10. Note that a bending frequency is 1 Hz, and the frequency twice as much as the bending frequency f is 2 Hz.

As illustrated in FIG. 13, signals are detected in the vicinity of the bending frequency f (=1.0 Hz) and the frequency twice as much as the bending frequency f (=2.0 Hz). In reality, components in the vicinity of the bending frequency f (=1.0 Hz) include a component due to asymmetry of a cross-sectional shape of the cable and a component due to asymmetricity between a plus direction and a minus direction of the bending angle in addition to a component due to variation of the resistance value caused by disconnection of a wire 11. A component in the vicinity of the frequency twice as much as the bending frequency f (=2.0 Hz) includes a component due to the variation of the resistance value caused by expansion and contraction of a conductor with bending of the cable 10. At a stage where any wire 11 is not disconnected, the component in the vicinity of the bending frequency f (=1.0 Hz) is smaller than the component in the vicinity of the frequency twice as much as the bending frequency f (=2.0 Hz). In FIG. 13, in a region after the number of times of bending reaches about 240,000 times, the component of the bending frequency f (=1.0 Hz) is clearly detected, and a component that exceeds the component in the vicinity of the frequency twice as much as the bending frequency f (=2.0 Hz) is also detected. For this reason, it is possible to estimate a time point when the number of times of bending reaches about 240,000 times as a time point when initial disconnection occurs. Namely, by using the method according to the second embodiment, it is possible to consider the asymmetry of the cross-sectional shape of the cable and the asymmetricity between the plus direction and the minus direction of the bending angle, and this makes it possible to detect disconnection clearly (and thus with high sensitivity) compared with the method according to the first embodiment.

Third Embodiment

Example of Application to Industrial Robot

FIG. 14 is a schematic view illustrating an example of the application to an industrial robot in a disconnection detecting system according to a third embodiment of the present invention. For example, an industrial robot 55 as illustrated in FIG. 14 is used widely. Various cables 10 for controlling motion of each of joints 56 are loaded on such an industrial robot 55 including portions around each of the joints 56.

Here, for example, when severe disconnection (for example, almost total disconnection) occurs in the cable 10, the industrial robot 55 may be stopped, and thus, a production process may be stopped. For this reason, it is desirable to detect minor disconnection (initial disconnection) that becomes a precursor of severe disconnection at an early stage before the severe disconnection occurs. Therefore, for example, at the time of periodic maintenance for the industrial robot 55, it is beneficial to detect this initial disconnection by using the method according to the first embodiment or the second embodiment.

Specifically, a system similar to that in case of FIG. 1A may be constructed, and the bending mechanism 20 illustrated in FIG. 1A may be configured by using the joints 56 of the industrial robot 55. Then, by using a joint control unit of the industrial robot 55 or by using an external device configured to apply external force to an arm of the industrial robot 55, as illustrated in FIG. 14, each of the joints 56 of the industrial robot 55 is caused to execute reciprocating motion in a rotational range (θ) of −90° to +90°, for example. A frequency of this reciprocating motion becomes the bending frequency f. Note that a state of the corresponding joint 56 illustrated in FIG. 14 is a state of θ=−90°.

Further, the measuring apparatus 30 illustrated in FIG. 1A may be added from the outside each time, or may be built in the industrial robot 55 in advance. Note that measurement procedure using such a configuration is similar to that illustrated in FIG. 11 or FIG. 12. However, the process at Step S101 (and S101A) in FIG. 11 (and FIG. 12) is unnecessary because of a state where the cable 10 has already been mounted thereon.

Further, in addition to such an example of the application, it is also beneficial to obtain life characteristics of a cable of the same type as the cable 10 used in the industrial robot 55 at a manufacturing stage by using the disconnection detecting system 1 as illustrated in FIG. 1A, and to reflect its result to the maintenance of the industrial robot 55. Specifically, by using the system illustrated in FIG. 1A, the number of times of bending at which initial disconnection may occur in the cable 10 can be determined. Therefore, for example, it is possible to provide this information on the number of times of bending to an administrator of the industrial robot 55. In this case, the administrator can take various kinds of countermeasures before severe disconnection occurs in the cable 10 by checking the number of times of bending thus provided and an operation history of the industrial robot 55.

Primary Effect of Third Embodiment

As described above, by using the disconnection detecting system and the disconnection detecting method according to the third embodiment, in addition to the various effects that have been mentioned in the first embodiment or the second embodiment, it becomes to detect initial disconnection of the cable 10, which has already been mounted in a predetermined system to become in an actual use state, with high sensitivity without removing the cable 10 from the predetermined system.

As described above, the invention made by inventors of the present application has been described specifically on the basis of the embodiments. However, the present invention is not limited to the embodiments described above, and it goes without saying that the present invention may be modified into various forms without departing from the substance thereof. For example, the embodiments described above have been explained in detail for explaining the present invention clearly. The present invention is not necessarily limited to one that includes all configurations that have been explained. Further, a part of the configuration of one embodiment can be replaced by a configuration of the other embodiment. Further, a configuration of the other embodiment can be added to a configuration of one embodiment. Further, a part of the configuration of each of the embodiments can be added to the other configuration, deleted, or replaced thereby.

For example, the example of the application to the industrial robot has been described herein, but of course, the present invention is not limited to this. When the present invention is applied to various kinds of systems that require high safety, such as cables for a vehicle, particularly beneficial effects can be obtained.

The invention claimed is:

1. A disconnection detecting system for detecting disconnection of any of a plurality of wires included in a cable, the disconnection detecting system comprising:
   a bending mechanism configured to periodically apply force to the cable so as to cause the cable to reciprocate between a first bending state and a second bending state, the first bending state being a state where the cable is bent in one direction of a clockwise direction and a counterclockwise direction, the second bending state being a state where the cable is bent in the other direction; and
   a measuring apparatus configured to measure a resistance value of the cable, the resistance value varying on a time series basis in accordance with the reciprocation of the bending mechanism, the measuring apparatus being further configured to extract a component of a bending frequency from frequency components included in time-series variation in the resistance value of the cable, the bending frequency being a frequency to reciprocate between the first bending state and the second bending state once, wherein the disconnection is detected on a basis of amplitude of the component of the bending frequency extracted by the measuring apparatus.

2. The disconnection detecting system according to claim 1,
wherein the measuring apparatus is further configured to extract a component of a frequency twice as much as the bending frequency from the frequency components included in the time-series variation in the resistance value of the cable, and
wherein the disconnection is detected in a case where the amplitude of the component of the bending frequency extracted by the measuring apparatus exceeds amplitude of the component of the frequency twice as much as the bending frequency.

3. The disconnection detecting system according to claim 2,
wherein the bending mechanism includes:
a rotary member movable around a central point in each of the clockwise direction and the counterclockwise direction;
a first bending member and a second bending member installed on the rotary member so as to sandwich the cable therebetween at the central point when the cable in a stretching state is mounted on the rotary member so as to pass through the central point; and
a fixing member installed on the rotary member so as to fix the cable in the stretching state to the rotary member at a different position from the central point.

4. The disconnection detecting system according to claim 3,
wherein at least a portion abutting on the cable of each of the first bending member and the second bending member is formed in an arc shape so as to bend the cable with a predetermined radius when the rotary member is moved.

5. The disconnection detecting system according to claim 2,
wherein the cable is mounted around a joint of an industrial robot, and
wherein the bending mechanism is configured by using the joint of the industrial robot.

6. The disconnection detecting system according to claim 2,
wherein the measuring apparatus includes a lock-in amplifier.

7. The disconnection detecting system according to claim 1,
wherein the bending mechanism includes:
a rotary member movable around a central point in each of the clockwise direction and the counterclockwise direction;
a first bending member and a second bending member installed on the rotary member so as to sandwich the cable therebetween at the central point when the cable in a stretching state is mounted on the rotary member so as to pass through the central point; and
a fixing member installed on the rotary member so as to fix the cable in the stretching state to the rotary member at a different position from the central point.

8. The disconnection detecting system according to claim 7,
wherein at least a portion abutting on the cable of each of the first bending member and the second bending member is formed in an arc shape so as to bend the cable with a predetermined radius when the rotary member is moved.

9. The disconnection detecting system according to claim 1,
wherein the cable is mounted around a joint of an industrial robot, and
wherein the bending mechanism is configured by using the joint of the industrial robot.

10. The disconnection detecting system according to claim 1,
wherein the measuring apparatus includes a lock-in amplifier.

11. A disconnection detecting method of detecting disconnection of any of a plurality of wires included in a cable, the disconnection detecting method comprising:
a first step of periodically applying force to the cable so as to cause the cable to reciprocate between a first bending state and a second bending state, the first bending state being a state where the cable is bent in one direction of a clockwise direction and a counterclockwise direction, the second bending state being a state where the cable is bent in the other direction;
a second step of measuring a resistance value of the cable, the resistance value varying on a time series basis in accordance with the first step, the second step being extracting a component of a bending frequency from frequency components included in time-series variation in the resistance value of the cable, the bending frequency being a frequency to reciprocate between the first bending state and the second bending state once; and
a third step of determining the disconnection on a basis of amplitude of the component of the bending frequency extracted in the second step.

12. The disconnection detecting method according to claim 11,
wherein the second step includes extracting a component of a frequency twice as much as the bending frequency from the frequency components included in the time-series variation in the resistance value of the cable, and
wherein the third step includes determining the disconnection in a case where the amplitude of the component of the bending frequency extracted in the second step exceeds amplitude of the component of the frequency twice as much as the bending frequency.

13. The disconnection detecting method according to claim 12,
wherein the third step is executed after the first step and the second step are continued for a predetermined period of time.

14. The disconnection detecting method according to claim 12,
wherein the cable is mounted around a joint of an industrial robot, and
wherein the first step includes causing the joint of the industrial robot to reciprocate in the clockwise direction and the counterclockwise direction.

15. The disconnection detecting method according to claim 11,
wherein the third step is executed after the first step and the second step are continued for a predetermined period of time.

16. The disconnection detecting method according to claim 11,
wherein the cable is mounted around a joint of an industrial robot, and wherein the first step includes causing the joint of the industrial robot to reciprocate in the clockwise direction and the counterclockwise direction.

* * * * *